United States Patent
Dai et al.

(10) Patent No.: US 7,372,147 B2
(45) Date of Patent: May 13, 2008

(54) SUPPORTING A CIRCUIT PACKAGE INCLUDING A SUBSTRATE HAVING A SOLDER COLUMN ARRAY

(75) Inventors: Xiang Dai, Roseville, CA (US); Dan Cromwell, Penryn, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 10/612,663

(22) Filed: Jul. 2, 2003

(65) Prior Publication Data

US 2005/0001310 A1 Jan. 6, 2005

(51) Int. Cl.
- H01L 23/34 (2006.01)
- H01L 29/40 (2006.01)
- H01L 21/00 (2006.01)
- H05K 7/20 (2006.01)

(52) U.S. Cl. ........... 257/707; 257/706; 257/718; 257/778; 438/108; 361/704

(58) Field of Classification Search ........ 257/718, 257/722, 707, 726, 706, 717
See application file for complete search history.

(56) References Cited

U.S. PATENT DOCUMENTS

| | | | | |
|---|---|---|---|---|
| 5,220,200 A * | 6/1993 | Blanton | 257/778 |
| 5,221,209 A * | 6/1993 | D'Amico | 439/71 |
| 5,402,077 A * | 3/1995 | Agahdel et al. | 324/758 |
| 5,528,462 A * | 6/1996 | Pendse | 361/767 |
| 5,621,615 A * | 4/1997 | Dawson | 361/704 |
| 5,875,096 A * | 2/1999 | Gates | 361/704 |
| 5,907,474 A * | 5/1999 | Dolbear | 361/705 |
| 5,949,137 A * | 9/1999 | Domadia et al. | 257/712 |
| 5,985,682 A * | 11/1999 | Higgins, III | 438/10 |
| 6,198,630 B1 * | 3/2001 | Cromwell | 361/704 |
| 6,205,026 B1 * | 3/2001 | Wong et al. | 361/704 |
| 6,252,768 B1 * | 6/2001 | Lin | 361/687 |
| 6,292,369 B1 * | 9/2001 | Daves et al. | 361/719 |
| 6,394,820 B1 * | 5/2002 | Palaniappa et al. | 439/83 |
| 6,404,638 B1 * | 6/2002 | Messina | 361/715 |
| 6,407,450 B1 * | 6/2002 | Verma et al. | 257/697 |
| 6,501,658 B2 * | 12/2002 | Pearson et al. | 361/709 |
| 6,541,710 B1 | 4/2003 | Deeney et al. | |
| 6,545,879 B1 * | 4/2003 | Goodwin | 361/807 |
| 6,618,251 B2 * | 9/2003 | Ishimine | 361/704 |
| 6,639,800 B1 * | 10/2003 | Eyman et al. | 361/704 |

(Continued)

OTHER PUBLICATIONS

R. Bargerhuff et al., Development of a Large Heatsink Support Structure, Proceedings of NEPCON Texas '97, Dallas, Oct. 1997.

*Primary Examiner*—Carl Whitehead, Jr.
*Assistant Examiner*—James M Mitchell

(57) ABSTRACT

A method supports, on a printed circuit board, a circuit package including a substrate having a solder column array. The method comprises providing the circuit package with an over-sized lid that extends outwardly over an edge of the substrate. The circuit package is electrically connected to the printed circuit board via the solder column array and a plurality of supports are secured to the printed circuit board in position underneath the lid of the circuit package while leaving a gap between the lid and the support. A static compressive force is applied and maintained to the circuit package relative to the printed circuit board, thereby causing the solder column array to creep until the gap is closed and a substantial portion of the compressive force is borne by the supports.

13 Claims, 4 Drawing Sheets

U.S. PATENT DOCUMENTS

| | | |
|---|---|---|
| 6,750,551 B1 * | 6/2004 | Frutschy et al. ............ 257/785 |
| 6,885,557 B2 * | 4/2005 | Unrein ...................... 361/704 |
| 2002/0074649 A1 * | 6/2002 | Chrysler et al. ............ 257/720 |
| 2002/0110335 A1 * | 8/2002 | Wagner et al. ................ 385/89 |
| 2002/0175404 A1 * | 11/2002 | Yoshikawa .................. 257/706 |
| 2003/0079861 A1 * | 5/2003 | Lee ........................... 165/80.3 |
| 2003/0085453 A1 * | 5/2003 | Eyman et al. .............. 257/678 |
| 2003/0094306 A1 | 5/2003 | Deeney et al. |
| 2003/0095392 A1 | 5/2003 | Deeney |
| 2004/0012079 A1 * | 1/2004 | Khiang ...................... 257/678 |
| 2004/0036162 A1 * | 2/2004 | Chuang et al. ............. 257/717 |
| 2004/0037059 A1 * | 2/2004 | Stiborek et al. ........... 361/764 |
| 2004/0095728 A1 * | 5/2004 | Bird et al. .................. 361/704 |
| 2004/0130876 A1 * | 7/2004 | Davison ..................... 361/719 |
| 2004/0134680 A1 * | 7/2004 | Dai et al. ................... 174/255 |
| 2004/0252462 A1 * | 12/2004 | Cromwell et al. .......... 361/719 |

* cited by examiner

SUPPORTING A CIRCUIT PACKAGE INCLUDING A SUBSTRATE HAVING A SOLDER COLUMN ARRAY

BACKGROUND

Ever since the advent of the first computer, there has been an unending drive to make computers and their components smaller, faster, and more powerful. These goals have created a whole new array of engineering concerns such as making a high number of robust electrical connections in very small spaces as well as providing for near-zero tolerance flatness of component casings. Other concerns include selecting materials to minimize differences in the coefficients of thermal expansion between the different types of conductive and non-conductive materials used in electronic components.

One type of computer-based electronic component is a column grid array integrated circuit package. These packages can be electrically connected and secured to a printed circuit board via an array of solder columns that extend from the integrated circuit package for connection to the printed circuit board. The material and dimensions of these solder column arrays generally accommodate the difference in thermal expansion between the printed circuit board and the integrated circuit package, which contributes to their strong joint reliability.

However, large integrated circuit packages also require large thermal solutions, such as heat sinks, which in turn place significant long-term static compressive loads on the solder columns. Moreover, in order to attach the appropriate sized thermal solution (e.g. heat sink) to the substrate and to insure a good thermal interface between the heat sink and the integrated circuit package, a significant retention load must be place on the package. With a large integrated circuit package, the solder columns cannot bear this long-term static compressive load for very long without exhibiting creep, and ultimately some form of failure mode, such as buckling, bending, and/or solder joint disruption. In particular, any load of more than about 10-20 grams per solder column will exceed the limits of the solder columns. In addition, solder columns experience short-term dynamic loading from shock and vibration during shipping and/or during mobile use. For these reasons, column grid array packages having solder columns arrays have limited application for interconnecting large or high power integrated circuit packages on printed circuit boards.

One attempt at overcoming these issues includes placing non-conductive, rigid column supports underneath the substrate of the integrated circuit packages to help bear the high retention load that is required. The load is translated through the substrate to the rigid column supports, which are positioned side-by-side with the solder columns to help bear the long-term, static compressive load. For example, see U.S. Pat. No. 6,541,710, titled METHOD AND APPARATUS OF SUPPORTING CIRCUIT COMPONENT SOLDER COLUMN ARRAY USING INTERSPERSED RIGID COLUMNS. However, to gain sufficient support from the rigid column supports, the integrated circuit package needs to be slightly larger to accommodate the non-conductive column locations within the contact array. Since space on the printed circuit board is at a premium, larger package sizes are less desirable.

Other attempts at supplementing mechanical support for solder column arrays include setting a shim underneath a portion of the integrated circuit package and using an epoxy adhesive to fix the shim in place relative to the package. Using an epoxy adhesive can be messy, difficult to precisely place, slow due to curing time, and can introduce additional stress and strain issues because the epoxy is fixed relative to the package and the shim. In addition, with an epoxy in place, it becomes difficult to remove the package in the event that reworking of the circuit board becomes necessary. Finally, adding an epoxy adds yet another material parameter to the already delicate task of matching coefficients of thermal expansion between materials of the substrate, solder columns, and printed circuit board.

Accordingly, solder column arrays remain a limiting factor in the size and power of integrated circuit packages that can be used in the column grid array configuration.

SUMMARY

One aspect of the present invention provides a method of supporting, on a printed circuit board, a circuit package including a substrate having a solder column array. The method comprises providing the circuit package with an over-sized lid that extends outwardlly over an edge of the substrate. The circuit package is electrically connected to the printed circuit board via the solder column array and a plurality of supports are secured to the printed circuit board in position underneath the lid of the circuit package while leaving a gap between the lid and the support. A static compressive force is applied and maintained to the circuit package relative to the printed circuit board, thereby causing the solder column array to creep until the gap is closed and a substantial portion of the compressive force is borne by the supports.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following Detailed Description, therefore, is not to be taken in a limiting sense, and the scope of the present invention is defined by the appended claims.

Figure 1:
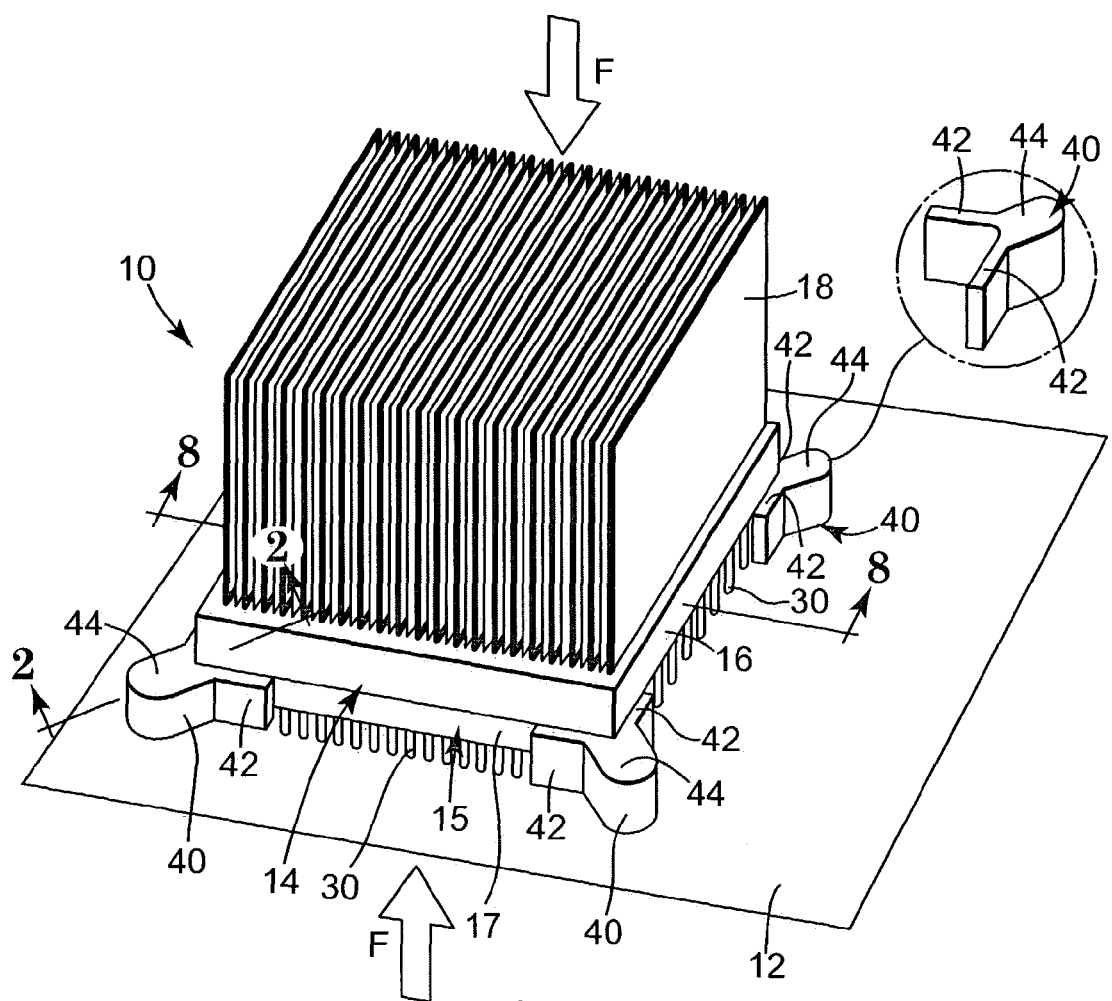
FIG. 1 is an isometric view of an electronic component system using a corner support for solder column arrays, according to an embodiment of the present invention.
Figure 2:
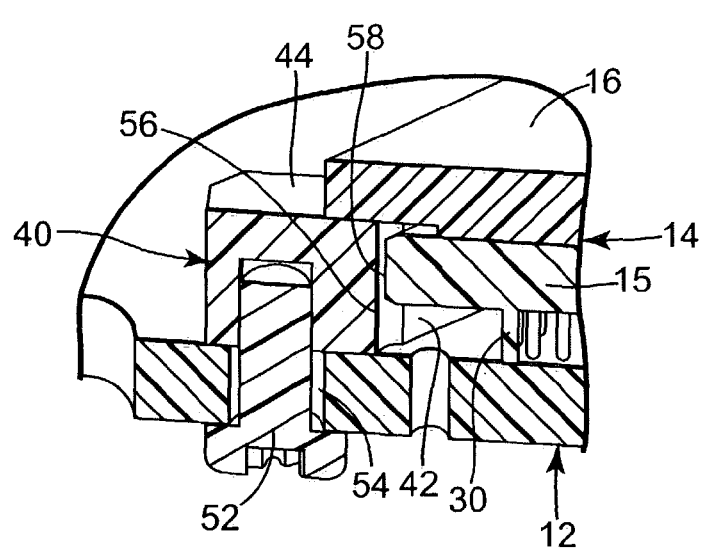
FIG. 2 is a partial sectional view of FIG. 1, according to an embodiment of the present invention.

FIG. 1 illustrates electronic component system 10 according to one embodiment of the present invention, which comprises printed circuit board 12, column grid array package 14, heat sink 18, and supports 40. Printed circuit board 12 carries a variety of electronic components, such as a plurality of column grid array packages, just one of which is shown in FIG. 2. FIG. 1 also shows a compressive force F acting on system 10. A mechanism for supplying this force is not shown in FIG. 1 to accentuate illustration of a package support of the present invention. However, mechanisms for supplying this force are further described and illustrated in association with FIGS. 4 and 8.

Column grid array package 14 includes substrate 15 having edge 17, over-sized lid 16, and solder column array 30. Column grid array package 14 is any electronic integrated circuit package for use in a circuit carried on printed circuit board 12 and that uses a solder column array for interconnection to printed circuit board 12. For example, column grid array package 14 can be a very large scale integration (VSLI) integrated circuit, such as a central processing unit (CPU) or application specific integrated circuit (ASIC), as well as other types of integrated circuits.

Edge 17 of substrate 15 of package 14 defines a periphery of substrate 15 while lid 16 extends outwardly over edge 17 of substrate 15. Solder column array 30 includes a plurality of solder columns 31 and extends from package 14 to electrically and mechanically connect package 14 to an electrically conductive contact array of printed circuit board 12 such as lead-free materials. Solder columns 31 are made of 90/10 solder, or other suitable material that provide good electrically conductivity, proper solder flow during soldering, and that exhibit predictable stress, strain, and creep characteristics.

Each package support 40 includes a pair of wing portions 42 and main body 44. Wing portions 42 extend outwardly from main body 44 and are generally perpendicular to each other. Wing portions 42 are sized and shaped to fit between lid 16 of package 14 and printed circuit board 12. Wing portions 42 support any load translated through lid 16 of package 14, such as the mass of heat sink 18, as well as a compressive load applied on system 10 by compression springs and/or plates, as further described and illustrated in association with FIG. 8. This support eliminates tension on solder columns 31 in a dynamic environment, like shock and vibration, and insures an optional thermal interface. Main body 44 of each support 40 is sized and shaped to receive a fastener (see FIG. 2) such as a screw mounted through the back side of printed circuit board 12 and into the bottom of support 40. Alternatively, main body 44 optionally receives a fastener through a top surface of support 40 for securing into printed circuit board 12.

FIG. 2 is a sectional view of FIG. 1 taken along lines 2-2. As shown in FIG. 2, each support 40 is secured to printed circuit board 12 with fastener 52, such as a screw or plug, through a mounting hole 54 in printed circuit board 12. Support 40 also optionally includes corner recess 56 which is sized and shaped to receive and make contact with corner 58 of package 14. As illustrated in FIGS. 1-2, lid 16 is over-sized (i.e., extending outwardly beyond edge 17 of substrate 15 of 14, to which lid 16 is coupled).

Supports 40 are not limited to the shape shown in FIG. 2. For example, main body 42 can have other shapes that are appropriate to the type of fastener used to secure support 40 relative to printed circuit board 12.

Each support 40 is made from a plastic material, composite material, or a metallic material, with the material selected to have a coefficient of thermal expansion (CTE) that generally matches a coefficient of thermal expansion of substrate 15 of package 14 and solder columns 31. In particular, the material is selected so that it does not expand faster than the combined coefficient of thermal expansion of substrate 15 and solder columns 31, thereby preventing the introduction of tension on solder columns 31. One composite material for constructing supports 40 includes aluminum silica carbide (ALSIC).

Figure 3:
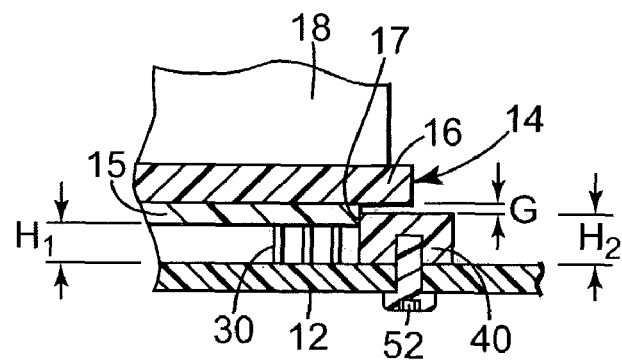
FIG. 3 is a sectional view of an electronic component system prior to implementing a solder column array support, according to an embodiment of the present invention.
Figure 4:
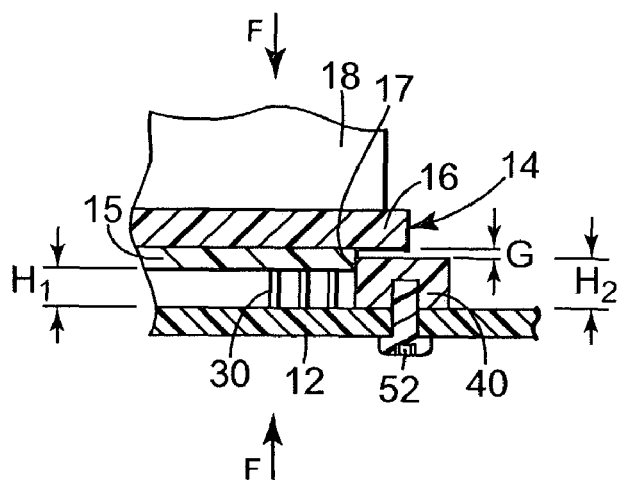
FIG. 4 is sectional view of the electronic component system during initial application of a compressive force, according to an embodiment of the present invention.
Figure 5:
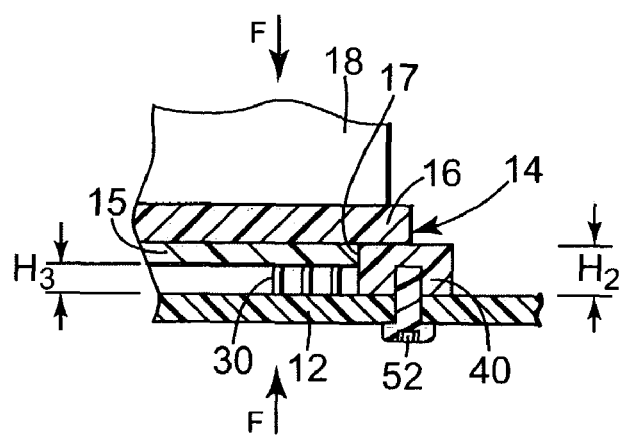
FIG. 5 is a sectional view of the electronic component system during long term application of the compressive force, according to an embodiment of the present invention.

A method of using supports 40 of the present invention is shown in FIGS. 3-5. FIGS. 3-5 illustrate a partial sectional view of system 10 of one corner of system 10. As shown in FIG. 3, column grid array package 14 includes substrate 15 and over-sized lid 16 with heat sink 18 mounted thereon. Lid 16 extends outwardly over edge 17 of substrate 15. Solder column array 30 of package 14 extends down to printed circuit board 12 establishing both a mechanical and electrical connection between package 14 and printed circuit board 12. Each solder column 31 of solder column array 30 has a height H1. Support 40 is positioned under lid 16 and has a height H2, such that a gap G, extends between lid 16 and support 40. Supports 40 are inserted underneath lid 16 after package 14 has been solder attached to printed circuit board 12 via solder column array 30. Support 40 is secured against printed circuit board 12 via fastener 52.

As shown in FIG. 3, H2 is greater than H1 so that support 40 does not extend underneath substrate 15 of package 14, and therefore support 40 does not directly support substrate 15. In this arrangement, any load caused by package 14, lid 16, and heat sink 18 is borne exclusively by solder column array 30. In addition, since supports 40 have a height H2 that is greater than height H1 of solder columns 31 (and greater than a distance between a bottom surface of package 14 and printed circuit board 12), supports 40 are limited to contacting edge 17 of substrate 15 rather than its bottom surface. This height feature of supports 40 eliminates any chance for electrical contact between support 40 and solder columns 31, which would cause a short circuit.

As shown in FIG. 4, in a first state of system 10, a long-term static compressive force F is applied on the components of system 10. The compressive force F generally is provided through a clamping mechanism (not shown) including springs, spring plate, load posts, compression screws, etc., to insure good thermal contact and to eliminate potential tension on solder columns 31 in dynamic environments. As this compressive force F is initially applied, gap G between lid 16 and support 40 remains for some period of time.

However, after some period of time, solder columns 31 of solder column array 30 begin to experience load creep under this compressive force F, causing solder columns 31 to deflect (i.e., decrease in height). In particular, solder columns 31 creep until they achieve a height H3, which is shown in FIG. 5. Height H3 of solder columns 31 in this second state of system 10 is less than height H1 of solder columns in their first state (shown in FIG. 3). With this decrease in the height of solder columns 31 from H1 to H3, gap G between lid 16 and printed circuit board 12 is closed. As gap G diminishes, a substantial portion of the compressive force F shifts from solder columns 31 to supports 40, thereby relieving solder columns 31 from exclusively bearing compressive force F and stopping creep on solder columns 31. In this second state, solder columns 31 still bear some load, which bolsters their joint reliability and electrical conductivity, and supports 40 bear a majority of compressive force F translated through over-sized lid 16. Nevertheless, at some point the load on solder columns 31 is sufficiently light that creep no longer acts on the solder columns, thereby preventing failure modes of bending, buckling, and/or solder joint disruption.

Accordingly, supports 40 removes the strength of solder columns 31 as a previously limiting constraint on the use of high compressive loads, which are used with large integrated circuit packages. Therefore, supports 40 of one embodiment of the present invention enable the use of solder column array interconnects for larger integrated circuit packages than was previously possible.

Supports 40 are implemented without the use of an epoxy to hold them in place relative to lid 16. This epoxy-free arrangement enhances the ability to match coefficients of thermal expansion between supports 40 and the rest of the assembly, such as lid 16 and printed circuit board 12. Moreover, epoxy-free securing of supports 40 eases reworking of assembly, in the event that substrate needs to be replaced. In this scenario, supports 40 do not act as a constraint in removing package 14 since supports 40 act only to support a compressive load toward printed circuit board 12 and do not restrict movement of package 14 and lid 16 away from printed circuit board 12.

Figure 6:
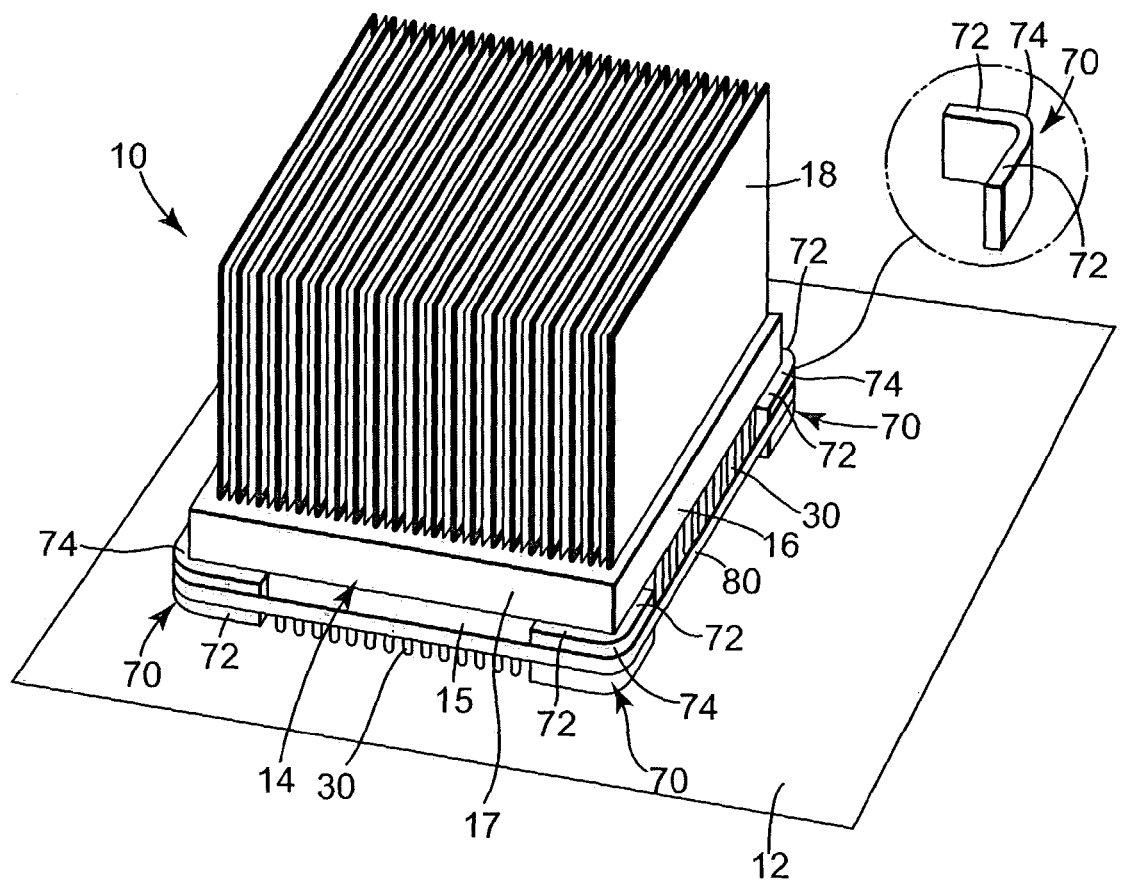
FIG. 6 is an isometric view of an alternate securing mechanism for a support, according to an embodiment of the present invention.

As shown in FIG. 6, in an alternate arrangement, supports 70 are held in place with band 80. Supports 70 comprise wing portions 72 and corner 74. In this arrangement, fasteners such as fasteners 52 shown in FIGS. 1-5, are not used to secure supports 70 relative to package 14 and lid 16 and/or relative to printed circuit board 12. Accordingly, since supports 70 do not need to receive a fastener corner 74 of support 70 is much smaller than main body 44 of support 40. This feature of supports 70 conserves space on printed circuit board 12.

Upon initial insertion of supports 70 under lid 16, band 80 holds supports 70 in place. After a static compressive force (a retention load) is applied to system 10 and creep acts on solder column array 30, supports 40 bear a majority of compressive force exerted on assembly 10 so that this vertical compressive force, in addition to the lateral force of band 80, holds supports 40 in place under lid 16.

Figure 7:
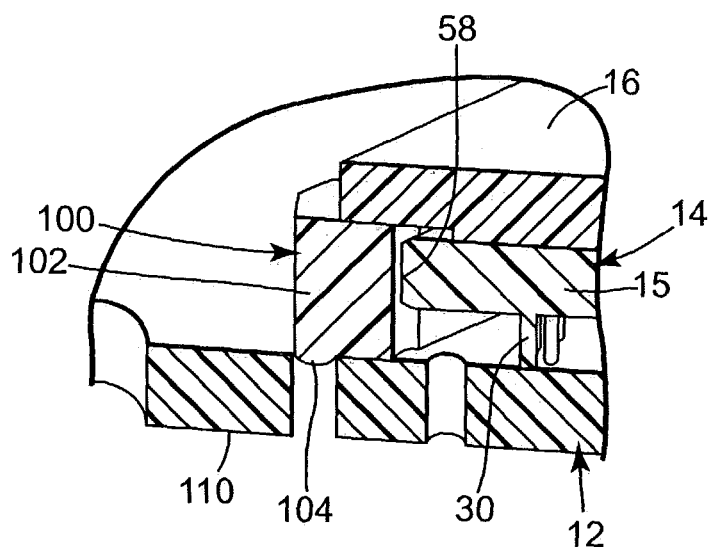
FIG. 7 is a partial sectional view of an alternate support of electronic component system, according to an embodiment of the present invention.

As shown in FIG. 7, alternate support 100 includes main body 102 and detent 104. Printed circuit board 12 includes hole 110 that is sized and shaped for receiving detent 104. In use, support 100 is secured to printed circuit board 12 by pressing detent 104 of support 100 into hole 110 of printed circuit board 12. Detent 104 is shaped and sized, and optionally flexible, to permit maneuvering of main body 102 of support under lid 16 while inserting detent 104 into hole 110. Detent 104 comprises a dimple, plug, or other shape that is configured for snap fitting into, or frictionally engaging, a portion of printed circuit board 12 to secure support 100 relative to printed circuit board 12. Hole 110 in printed circuit board 12 also can have other shapes, such as a slot, groove, slanted hole, etc., to facilitate insertion of detent 104. Main body 102 of support 100 is smaller than main body 44 of support 40, since main body 102 only need carry detent 104 and need not provide receiving support of a fastener, such as a screw. Accordingly, support 100 can further save space on printed circuit board 12.

Finally, while supports are shown implemented at corners of package 14, which enhances their stability and strength, supports optionally can be implemented at locations other than the corners, such as along the sides of package 14.

Figure 8:
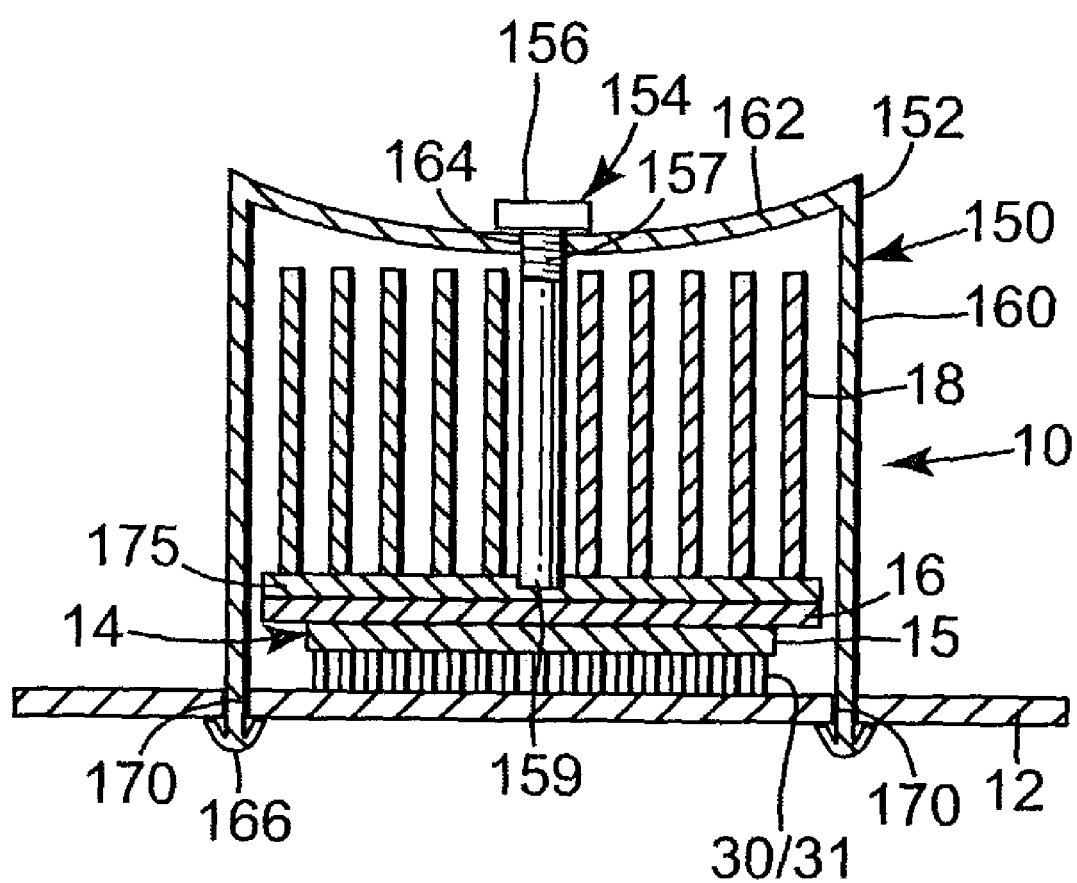
FIG. 8 is a modified sectional view of FIG. 1, as taken along lines 8-8.

FIG. 8 is a modified sectional view of FIG. 1 as taken along lines 8-8. FIG. 8 shows an exemplary embodiment of a compressive force mechanism 150 for applying a static compressive force F to system 10, as is shown in FIGS. 1 and 4-5. Supports 40, 70, and 100 of the present invention support this compressive force F to prevent it from damaging solder column array 30, as previously described. Supports 40, 70,100 are not shown with the rest of system 10 for simplicity in illustrating compressive mechanism 150. This type of compressive mechanism, and other compressive mechanisms suitable for applying a compressive force F as described in association with FIGS. 1-7 are disclosed in U.S. Pat. No. 6,198,630, which is hereby incorporated by reference.

Compressive mechanism 150 comprises spring member 152 and compression screw 154. Compression screw 154 includes crown 156, threads 157, shaft 158, and end 159. Spring member 152 includes side walls 160, top wall 162, and ends 166. Spring member 152 is sized and shaped to fit over heat sink 18 of system 10, which is already mounted on package 14. Compressive mechanism 150 also optionally comprises a stiffening or backing plate for mounting on the opposite side of printed circuit board 12 to further support system 10.

In use, with package 14 already solder attached to printed circuit board 12 via solder column array 30 and with heat sink already mounted on package 14, compressive mechanism 150 is applied. First, with spring member 152 positioned over heat sink 18, ends 166 of spring member 152 are removably inserted into holes 170 of printed circuit board 12, thereby fixing spring member 152 relative to printed circuit board. Compression screw 154 is then inserted through hole 164 in top wall 162 of spring member 152 to extend through a center portion of heat sink 18, with its end 159 resting within base 175 of heat sink 18. As compression screw 154 is threadably inserted, compression screw 154 causes top wall of spring member 152 to deflect, which in turn applies a compressive force to heat sink 18 and the rest of system 10. Top wall 162 of compressive mechanism 150 is maintained at a desired level of deflection via compression screw 154 to apply and maintain a desired static compressive force on system 10.

Accordingly, package supports of the present invention can be used as shims to shift high retention loads from the solder column arrays to the package supports, thereby liberating column grid array packages to be sized larger than was previously possible due to the limited column strength of solder column arrays. In addition, by supporting an over-sized lid of the packages, the package supports can also reduce the load borne by the substrate of the package to further reduce bowing and stress on the delicate circuitry within the package. Finally, package supports can also take advantage of the limited creep of the solder columns that occurs during gradual loading of the package supports to increase solder joint reliability of the solder columns.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. An assembled electronic component system comprising:
   a printed circuit board;
   an integrated circuit package including a substrate and a lid, the substrate having a solder column array connected directly to the printed circuit board and the lid including an extended portion that extends directly from the substrate outwardly over an edge of the substrate, the integrated circuit package including four corners;
   a plurality of supports that are separate and distinct from each other, the respective supports disposed directly on the printed circuit board and spaced apart from each other to position each respective support at the respective corners of the integrated circuit package, each support including a body and a pair of wings extending from the body to be substantially perpendicular to each other for contacting the edges of the substrate of the integrated circuit package and the wings of the support being sized and shaped to extend underneath the extended portion of the lid of the integrated circuit package, wherein the body is sized and shaped to extend outwardly in a direction generally opposite from the wings to be exposed relative to, and not in contact with the extended portion of the lid, wherein the wings of the support are sized and shaped to contact and vertically support the extended portion of the lid of the integrated circuit package, and wherein a height of the wings of the respective support is substantially equal to a creep induced height of the solder column array;
   a compressive force mechanism applying a compressive force on the integrated circuit package against the printed circuit board, with the compressive force translated from the integrated circuit package to the printed circuit board through both the solder column array of the integrated circuit package and the wings of the supports via the extended portion of the lid of the integrated circuit package; and
   a heat sink removably secured on top of the lid of the integrated circuit package via the compressive force, the lid of the integrated circuit package being separate from and independent of the heat sink.

2. The system of claim 1 wherein the solder column array has a first pre-assembly height and a second post-assembly height, the second post-assembly height being less than the first pre-assembly height.

3. The system of claim 1 wherein each support includes a detent and the printed circuit board includes a plurality of holes shaped and sized for receiving the detent of the supports so that each support is secured to the printed circuit board upon insertion of the detent of the support into the hole of the printed circuit board.

4. The system of claim 1 wherein each support is made from at least one of a plastic material and a composite material, with the material having a coefficient of thermal expansion that is substantially the same as a coefficient of thermal expansion of the substrate and the solder column array.

5. The system of claim 1 wherein the body of the support is sized, shaped, and positioned relative to the integrated circuit package to be secured relative to the printed circuit board via a fastener extending through the printed circuit board and into the body of the support.

6. The system of claim 1 wherein the supports are configured to be mechanically fastened to the printed circuit board without an adhesive and configured to vertically support the lid of the integrated circuit package without an adhesive between the extended portion of the lid of the integrated circuit package and the respective supports.

7. The system of claim 1, wherein the electronic component system comprises a computer system.

8. An assembled electronic component system comprising:
   a printed circuit board;
   an integrated circuit package including a substrate and a lid, the substrate including a solder column array directly connected to the printed circuit board and the lid including an extended portion that extends outwardly from the substrate over an edge of the substrate, the integrated circuit package including four corners;
   a plurality of supports that are separate and distinct from each other, the respective supports disposed directly on the printed circuit board and spaced apart from each other to position each respective support at the respective corners of the integrated circuit package, with each support comprising a pair of wing portions that are generally perpendicular to each other and joined together at one end to define a corner of the respective supports, each wing portion of the respective supports extending underneath the extended portion of the lid of the integrated circuit package between the lid and the printed circuit board, and each wing portion of the respective supports being sized and shaped to contact and vertically support the extended portion of the lid of the integrated circuit package, wherein a height of the wing portions of the respective support is substantially equal to a creep induced height of the solder column array;
   a single band, separate and distinct from the respective supports, sized and shaped to surround and contact all of the respective supports and apply a lateral force against the wing portions and the corners of the respective supports to removably secure the respective supports in position underneath the extended portion of lid of the integrated circuit package and to maintain the respective supports in position relative to the printed circuit board;
   a compressive force mechanism applying a compressive force on the integrated circuit package against the printed circuit board with the compressive force translated through both the solder column array and the wings of the respective supports via the extended portion of the lid of the integrated circuit package; and
   a heat sink removably secured on top of the lid of the integrated circuit package via the compressive force with the heat sink being separate from and independent of the lid of the integrated circuit package.

9. The system of claim 8, wherein the electronic component system comprises a computer system.

10. An assembled electronic component system comprising:
    a printed circuit board;
    an integrated circuit package including a substrate and a lid, the substrate having a solder column array connected directly to the printed circuit board and the lid including an extended portion that extends directly from the substrate outwardly over an edge of the substrate, the integrated circuit package including four corners;

a plurality of supports that are separate and distinct from each other, the respective supports disposed directly on the printed circuit board and spaced apart from each other to position each respective support at the respective corners of the integrated circuit package, each support including a pair of wings substantially perpendicular to each other for contacting the edges of the substrate of the integrated circuit package and the wings of the support being sized and shaped to extend underneath the extended portion of the lid of the integrated circuit package to be in contact with, and vertically support, the extended portion of the lid of the integrated circuit package;

a compressive force mechanism applying a compressive force on the integrated circuit package against the printed circuit board, with the compressive force translated from the extended portion of the lid of the integrated circuit package to the printed circuit board through both the solder column array of the integrated circuit package and the wings of the supports, wherein a height of the wings of the respective supports is substantially equal to a creep-induced height of the solder column array of the integrated circuit package; and a heat sink removably secured on top of the lid of the integrated circuit package via the compressive force, the lid of the integrated circuit package being separate from and independent of the heat sink.

11. The system of claim 10 wherein each support is made from at least one of a plastic material and a composite material, with the material having a coefficient of thermal expansion that is substantially the same as a coefficient of thermal expansion of the substrate and the solder column array.

12. The system of claim 10 each support including a body that extends outwardly in a direction generally opposite from the wings to be exposed relative to, and not in contact with the extended portion of the lid, the body of the respective supports being directly secured to the printed circuit board.

13. The system of claim 10 wherein the supports are configured to be mechanically fastened to the printed circuit board without an adhesive and configured to vertically support the lid of the integrated circuit package without an adhesive between the lid of the integrated circuit package and the respective supports.

* * * * *